United States Patent
Hsu et al.

(10) Patent No.: US 9,831,165 B2
(45) Date of Patent: Nov. 28, 2017

(54) INTERPOSER SUBSTRATE AND METHOD OF MANUFACTURING THE SAME

(71) Applicant: PHOENIX PIONEER TECHNOLOGY CO., LTD., Hukou Township (TW)

(72) Inventors: Che-Wei Hsu, Hukou Township (TW); Shih-Ping Hsu, Hukou Township (TW); Chih-Wen Liu, Hukou Township (TW)

(73) Assignee: PHOENIX PIONEER TECHNOLOGY CO., LTD., Hukou Township, Hsinchu County (TW)

( * ) Notice: Subject to any disclaimer, the term of this patent is extended or adjusted under 35 U.S.C. 154(b) by 0 days.

(21) Appl. No.: 14/547,743

(22) Filed: Nov. 19, 2014

(65) Prior Publication Data

US 2016/0064317 A1    Mar. 3, 2016

(30) Foreign Application Priority Data

Aug. 29, 2014 (TW) .............................. 103129812 A

(51) Int. Cl.
| | |
|---|---|
| *H01L 23/498* | (2006.01) |
| *H01L 21/48* | (2006.01) |
| *H01L 23/13* | (2006.01) |
| *H01L 23/14* | (2006.01) |
| *H05K 3/20* | (2006.01) |
| *H05K 3/46* | (2006.01) |

(52) U.S. Cl.
CPC ...... *H01L 23/49827* (2013.01); *H01L 21/486* (2013.01); *H05K 3/4682* (2013.01); *H01L 23/13* (2013.01); *H01L 23/145* (2013.01); *H01L 2924/0002* (2013.01); *H05K 3/205* (2013.01); *H05K 3/4647* (2013.01); *H05K 2201/09563* (2013.01); *H05K 2201/10378* (2013.01); *H05K 2203/0152* (2013.01)

(58) Field of Classification Search
CPC ............ H01L 23/49827; H01L 21/486; H05K 3/4682

See application file for complete search history.

(56) References Cited

U.S. PATENT DOCUMENTS 7,049,692 B2 * 5/2006 Nishimura .......... H01L 23/3128
257/686

\* cited by examiner

*Primary Examiner* — Long Pham
(74) *Attorney, Agent, or Firm* — Steptoe & Johnson LLP

(57) ABSTRACT

A method of manufacturing an interposer substrate, including providing a carrier having a first circuit layer formed thereon, forming a plurality of conductive pillars on the first circuit layer, forming a first insulating layer on the carrier, with the conductive pillars being exposed from the first insulating layer, forming on the conductive pillars a second circuit layer that is electrically connected to the conductive pillars, forming a second insulating layer on the second surface of the first insulating layer and the second circuit layer, exposing a portion of a surface of the second circuit layer from the second insulating layer, and removing the carrier. The invention further provides the interposer substrate as described above.

6 Claims, 4 Drawing Sheets

INTERPOSER SUBSTRATE AND METHOD OF MANUFACTURING THE SAME

BACKGROUND OF THE INVENTION

1. Field of the Invention

The present invention relates to interposer substrates, and, more particularly, to an interposer substrate used in stacked packages and a method of manufacturing the interposer substrate.

2. Description of Related Art

As the semiconductor packaging technology continues to advance, various types of packages of the semiconductor device have been developed, in order to increase electrical functionality and reduce packaging space. For instance, a Package on Package (PoP) is developed having multiple packaging structures stacked on one another. This type of package has the property of heterogeneous integration of a System in Package (SiP), and is capable of incorporating and integrating various electronic components of different functions, such as memory, central processing unit, graphic processor, image processor, etc., in a package through stacking, thereby is very suitable to be used in various low-profile electronic products.

Early stacked packages are formed by stacking memory packages (memory IC) over the logic packages (logic IC) via a plurality of solder balls. As the demand for light-weight and low profile electronic products, the density of wiring on the memory package increases. The memory package is measured in nanometers; the distance between the contact points are further shortened. However, the distances between the logic packages are measured in micrometers, and cannot be miniaturized further to comply with the distances between the memory packages. As a result, even a memory package with high density wiring is provided, there is no suitable logic package to go in concert with the memory package, thereby unable to achieve efficient production of the electronic products.

Accordingly, in order to overcome the above mentioned drawbacks, an interposer substrate is disposed between the memory package and logic package, such that the logic package having logic chips with higher distance therebetween is coupled to the bottom surface of the interposer substrate while the memory package having memory chips with smaller distance therebetween is coupled to the top surface of the interposer substrate.

FIGS. 1A-1F are cross-sectional views showing a process of manufacturing a conventional interposer substrate 1, 1'.

As shown in FIG. 1A, a carrier 10 having a metal material formed on two sides thereof is provided.

As shown in FIG. 1B, a plurality of electrical connecting pads 11 are formed on the carrier 10 through the pattering process.

As shown in FIG. 1C, a plurality of first conductive pillars 12 are electro-platted on the electrical connection pads 11 through the patterning process.

As shown in FIG. 1D, a first insulating layer 13 is formed on the carrier 10 for encapsulating the first conductive pillars 12 and the electrical connection pads 11, and a terminal surface of the first conductive pillars 12 is flush with the surface of the first insulating layer 13.

As shown in FIG. 1E, a wiring layer 14 is formed on the first insulating layer 13 and the first conductive pillars 12, a plurality of second conductive pillars 15 are formed on the wiring layer 14, and a second insulating layer 16 is then formed on the first insulating layer 13 for encapsulating the second conductive pillars 15 and the circuit layer 14. A portion of the surface of second conductive pillars 15 is exposed, for the solder ball pads to be formed thereon.

As shown in FIG. 1F, the entire carrier 10 is removed, allowing the electrical connection pads 11 to be exposed from the surface of the first insulating layer 13. Alternatively, as shown in FIG. 1F', a portion of the carrier 10 is etched away through patterning, allowing a remaining potion of the carrier to act as a supporting structure 10'.

However, in the method of manufacturing a conventional interposer substrate 1, a second insulating layer 16 acts as a solder mask layer, and it is required to have second conductive pillars 15 for the solder ball pads to be disposed thereon. As a result, the overall manufacturing steps and overall cost are undesirably increased.

Hence, there is an urgent need to solve the foregoing problems encountered in the prior art.

SUMMARY OF THE INVENTION

In view of the foregoing problems, the present invention provides an interposer substrate, comprising: a first insulating layer having a first surface and a second surface opposing the first surface; a first wiring layer formed on the first surface of the first insulating layer; a plurality of conductive pillars formed in the first insulating layer and on the first wiring layer, and connected to the second surface of the first insulating layer; a second wiring layer formed on the second surface of the first insulating layer and electrically connected with the conductive pillars; a second insulating layer formed on the second surface of the first insulating layer and the second wiring layer, wherein a portion of a surface of the second wiring layer is exposed from the second insulating layer.

The present invention further provides a method of manufacturing an interposer substrate, comprising: providing a carrier having a first wiring layer and a plurality of conductive pillars disposed on the first wiring layer; forming on the carrier a first insulating layer that has a first surface and a second surface opposing the first surface and is coupled to the carrier via the first surface thereof, with the conductive pillars being exposed from the second surface of the first insulating layer; forming on the second surface of the first insulating layer and the conductive pillars a second wiring layer that is electrically connected with the conductive pillars; forming on the second surface of the first insulating layer and the second wiring layer a second insulating layer, from which a portion of a surface of the second wiring is exposed; and removing the carrier to allow the first wiring layer to be exposed from the first surface of the first insulating layer.

In an embodiment, the entire carrier is removed.

In an embodiment, the first insulating layer is formed on the carrier through a molding, coating, or lamination method, and the first insulating layer is made of a molding compound, a primer material, or a dielectric material.

In an embodiment, the surface of the first wiring layer is lower than the first surface of the first insulating layer.

In an embodiment, the terminal surface of each of the conductive pillars is flush with the second surface of the first insulating layer.

In an embodiment, the second wiring layer acts as a plurality of solder ball pads.

In an embodiment, the surface of the second wiring layer is flush with the surface of the second insulating layer.

In an embodiment, the second insulating layer is formed by a molding, coating or lamination method, and the first insulating layer is made of a molding compound, a primer, or a dielectric materials.

In an embodiment, a portion of the carrier is retained and acts as the supporting structure for the first surface of the first insulating layer.

Accordingly, in the interposer substrate and the method of manufacturing the same according the present invention, the second wiring layer is formed with solder ball pads therein, without the need of conventional conductive pillars. As a result, the steps of the manufacturing process can be reduced, as well as the cost.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "upper", "first", "second" and "one" etc., are merely for illustrative purpose and should not be construed to limit the scope of the present invention.

FIGS. 2A-2F are cross-sectional views showing a method of manufacturing an interposer substrate (coreless) according to the present invention. In an embodiment, the interposer substrate 2 is a carrier used in a flip-chip chip scale package (FCCSP).

Figure 1A:
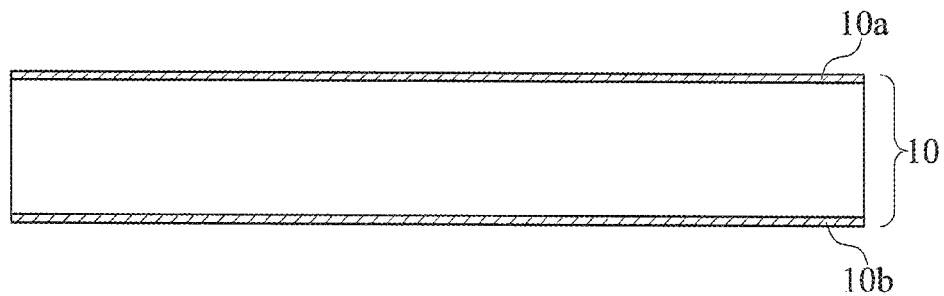
FIGS. 1A-1F are cross-sectional views showing a method of manufacturing a conventional interposer substrate, wherein FIG. 1F' is another embodiment of FIG. 1F.
Figure 1B:
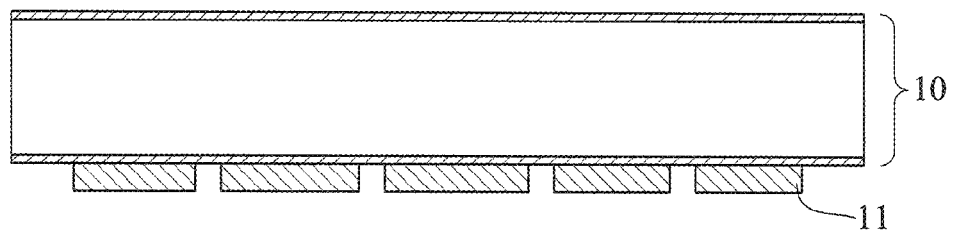
Figure 1C:
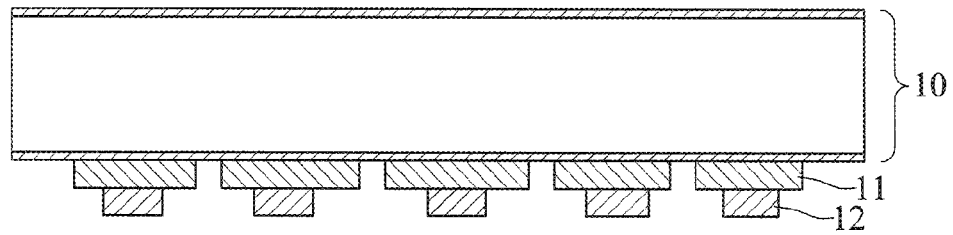
Figure 1D:
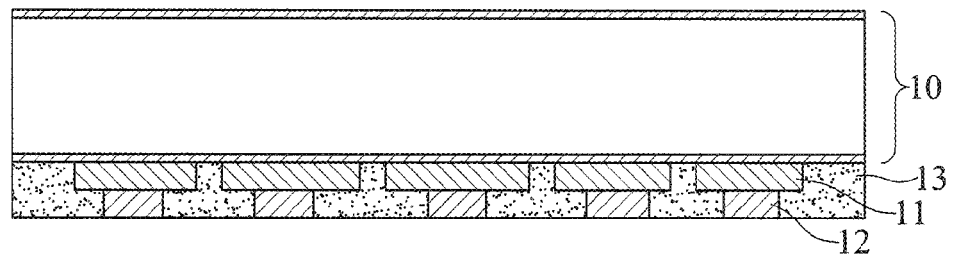
Figure 1E:
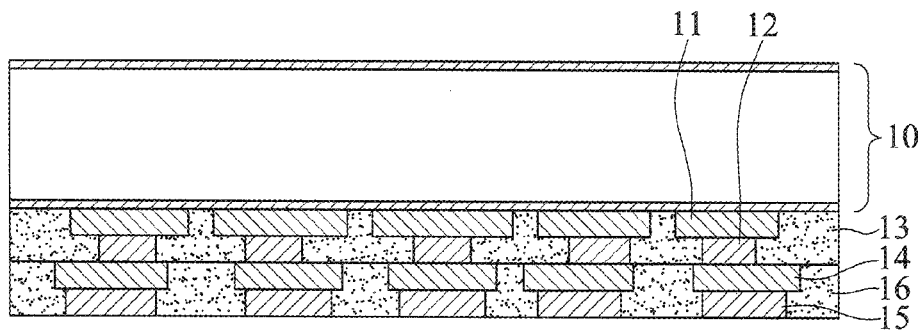
Figure 1F:
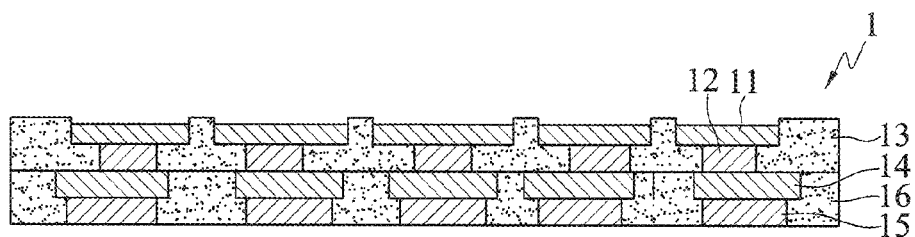
Figure 1F:
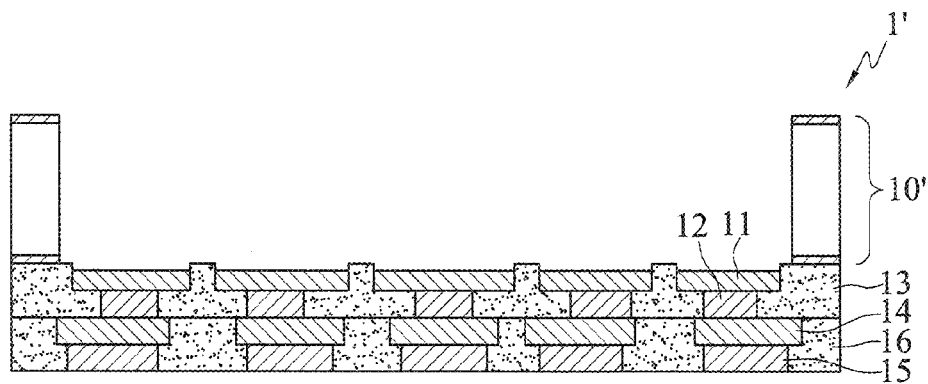
Figure 2A:
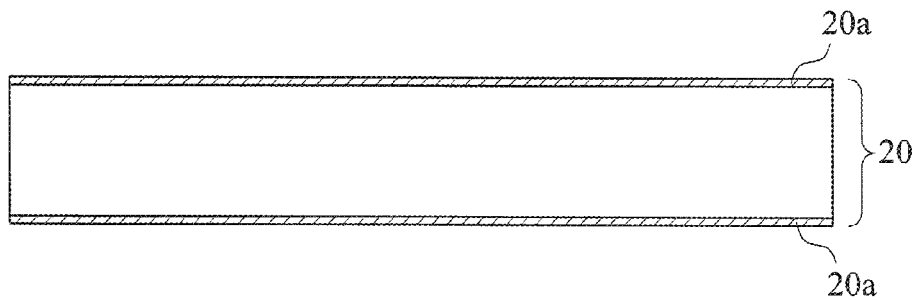
FIGS. 2A-2F are cross-sectional views showing a method of manufacturing an interposer substrate according to the present invention, wherein FIG. 2F' is another embodiment of FIG. 2F.

As shown in FIG. 2A, a carrier 20 is provided. In an embodiment, the carrier 20 is a substrate such as a copper foil substrate, but the present invention is not limited thereto. An embodiment uses the copper foil substrate having a metal material 20a on the two sides thereof as an example.

Figure 2B:
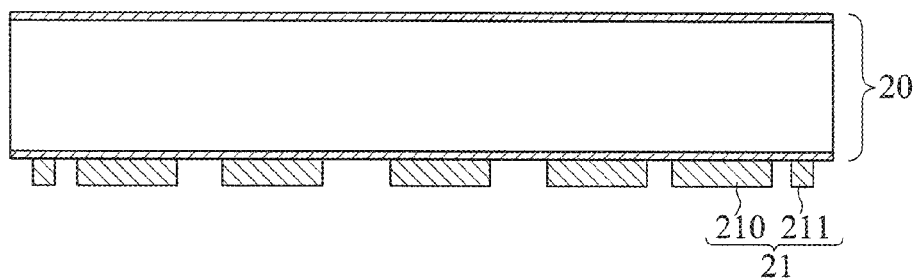

As shown in FIG. 2B, a first wiring layer 21 is formed on the carrier 20 through a patterning process.

In an embodiment, the first wiring layer 21 comprises a plurality of electrical connecting pads 210 and a plurality of conductive traces 211.

Figure 2C:
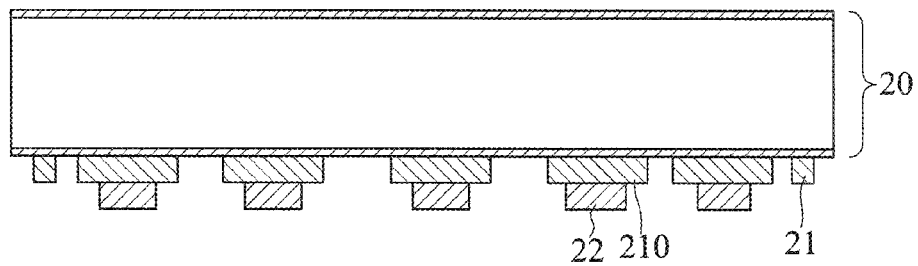

As shown in FIG. 2C, a plurality of conductive pillars 22 are electro-patterned on electrical connection pads 210 of the first wiring layer 21 through a patterning process.

In an embodiment, the conductive pillars 22 are in contact and electrically connected with the electrical connection pads 210 of the first wiring layer 21.

Figure 2D:
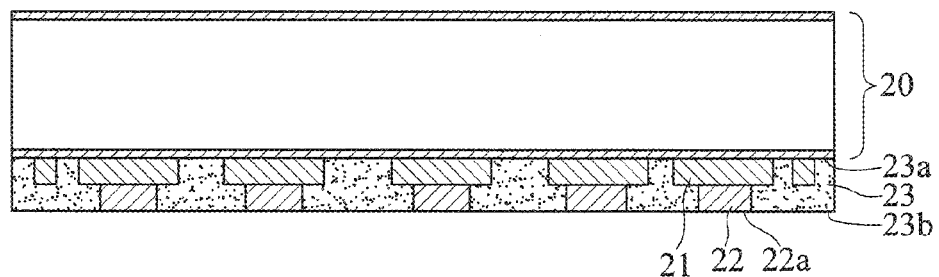

As shown in FIG. 2D, a first insulating layer 23 is formed on the carrier 20, the first insulating layer 23 has a first surface 23a and second surface 23b opposing the first surface 23a, the first insulating layer 23 is coupled to the carrier 20 via the first surface 23a of the insulating layer 23, and the conductive pillars 22 are exposed from the second surface 23b of the first insulating layer 23.

In an embodiment, the first insulating layer 23 is formed on the carrier 20 by a molding, coating or lamination method, and the first insulating layer 23 is made of a molding compound, a primer, or a dielectric material such as epoxy.

In an embodiment, the terminal surface 22a of each of the conductive pillars 22 is flush with second surface 23b of the first insulating layer 23.

Figure 2E:
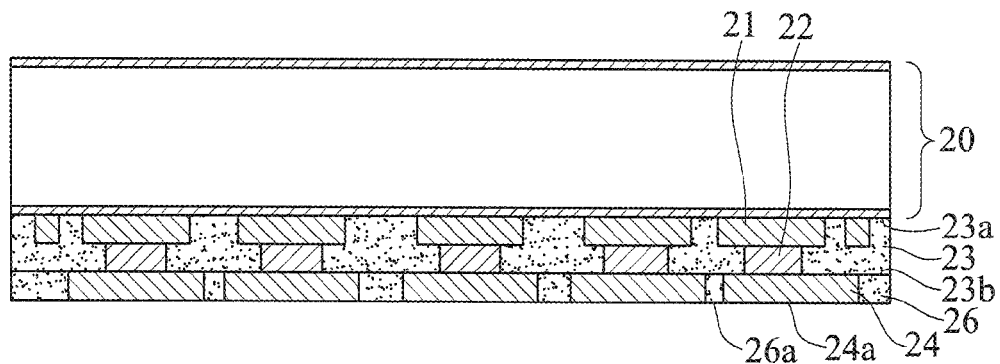

As shown in FIG. 2E, a second wiring layer 24 is formed on the second surface 23b of the first insulating layer 23 and the conductive pillars 22, and a second insulating layer 26 is formed on the second surface 23b of the first insulating layer 23 for encapsulating the second wiring layer 24.

In an embodiment, the second wiring layer 24 is a plurality of solder ball pads for coupling with the solder balls (not shown), and a portion of the surface of the second wiring layer 24 is exposed from the second insulating layer 26. For example, the surface 24a of the second wiring layer 24 is flush with or lower than the surface 26a of the second insulating layer 26.

In an embodiment, the second insulating layer 26 is formed by a molding, coating or lamination method, and the second insulating layer 26 is made of a molding compound, epoxy, or a dielectric material.

Figure 2F:
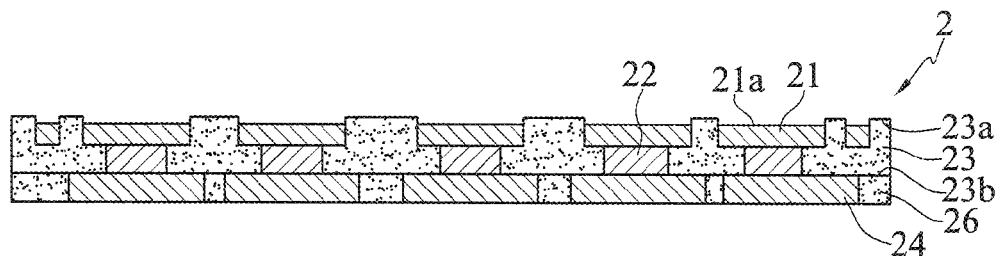
Figure 2F:
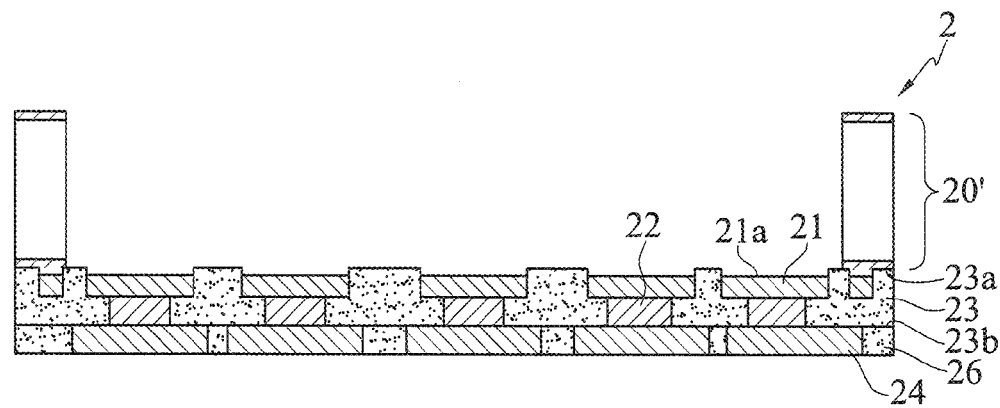

As shown in FIG. 2F, the entire carrier 20 is removed, allowing the surface 21a of the first wiring layer 21 to be exposed from the first surface 23a of the first insulating layer 23, and the surface 21a of the first wiring layer 21 is lower than the first surface 23a of the first insulating layer 23.

In an embodiment, the metal material 20a is removed by etching. The upper surface 21a of the first wiring layer 21 is slightly etched away, allowing the upper surface 21a of the first wiring layer 21 to be recessed on the first surface 23a of the first insulating layer 23.

As shown in FIG. 2F', a portion of the carrier 20 is etched away, allowing the remaining carrier to act as a supporting structure 20', and the surface 21a of the first wiring layer 21 is exposed from the first surface 23a of the first insulating layer 23.

Accordingly, the second wiring layer 24 having solder ball pads can be directly formed after forming a plurality of conductive pillars 22, so as to reduce the manufacturing process and cost.

The present invention further provides an interposer substrate 2, 2': having a first insulating layer 23, a first wiring layer 21, a plurality of conductive pillars 22, a second wiring layer 24, and a second insulating layer 26.

The first insulating layer 23 has a first surface 23a and a second surface 23b opposing the first surface 23a, and the first insulating layer 23 is made of a molding compound, epoxy, or a dielectric material.

The first wiring layer 21 is embedded in the first surface 23a of the first insulating layer 23, and the surface 21a of the first wiring layer 21 is lower than the first surface 23a of the first insulating layer 23.

The conductive pillars 22 are formed in the first insulating layer 23 and coupled to the second surface 23b of the first insulating layer 23, and the terminal surface 22a of each of the conductive pillars 22 is flush with the second surface 23b of the first insulating layer 23.

The second wiring layer 24 is formed on the second surface 23b of the first insulating layer 23 and the conductive pillars 22 and electrically connected with the conductive pillars 22, and is formed by a plurality of solder balls.

The second insulating layer 26 is formed on the second surface 23b of the first insulating layer 23 and the second wiring layer 24, allowing a portion of the surface of the second wiring layer 24 to be exposed from the second insulating layer 26.

In an embodiment, the surface 24a of the second wiring layer 24 may be flush with or lower than the surface 26a of the second insulating layer 26.

In an embodiment, the interposer substrate 2' further comprises a supporting structure 20' formed on the first surface 23a of the first insulating layer 23.

In summary, the interposer substrate and the method of manufacturing the same according to the present invention are applied in products having a stacked structure with fine pitch and high pin number, such as a smart phone, tablet, internet, and laptop. The interposer substrate according to the present invention is highly desirable to be used in products that require high speed operation, low profile, high functionality, and high storage.

In an embodiment, the interposer substrate 2, 2' according to the present invention can be coupled to a logic package or memory package via the first wiring layer 21.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An interposer substrate, comprising:
a first insulating layer having a first surface and a second surface opposing to the first surface;
a first wiring layer formed on the first surface of the first insulating layer wherein the first wiring layer has a surface lower than the first surface of the first insulating layer;
a plurality of conductive pillars formed in the first insulating layer and on the first wiring layer, and connected to the second surface of the first insulating layer;
a second wiring layer formed on the second surface of the first insulating layer and electrically connected with the conductive pillars; and
a second insulating layer formed on the second surface of the first insulating layer and the second wiring layer,
wherein a portion of a surface of the second wiring layer is exposed from the second insulating layer, and the surface of the second wiring layer is flush with or lower than a surface of the second insulating layer and free from being in contact with the second surface of the first insulating layer.

2. The interposer substrate of claim 1, wherein the first insulating layer is made of a molding compound, a primer, or a dielectric material.

3. The interposer substrate of claim 1, wherein the conductive pillars have a terminal surface flush with the second surface of the first insulating layer.

4. The interposer substrate of claim 1, wherein the second wiring layer is a plurality of solder ball pads.

5. The interposer substrate of claim 1, wherein the second insulating layer is made of a molding compound, a primer, or a dielectric material.

6. The interposer substrate of claim 1, further comprising a supporting structure disposed on the first surface of the first insulating layer.

* * * * *